(12) United States Patent
Basker et al.

(10) Patent No.: US 8,883,578 B2
(45) Date of Patent: Nov. 11, 2014

(54) STRAINED SILICON NFET AND SILICON GERMANIUM PFET ON SAME WAFER

(71) Applicant: International Business Machines Corporation, Armonk, NY (US)

(72) Inventors: Veeraraghavan S. Basker, Schenectady, NY (US); Chun-chen Yeh, Clifton Park, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/031,108

(22) Filed: Sep. 19, 2013

(65) Prior Publication Data

US 2014/0264601 A1 Sep. 18, 2014

Related U.S. Application Data

(63) Continuation of application No. 13/800,984, filed on Mar. 13, 2013.

(51) Int. Cl.
| | | |
|---|---|---|
| *H01L 29/16* | (2006.01) | |
| *H01L 29/165* | (2006.01) | |
| *H01L 21/02* | (2006.01) | |
| *H01L 21/8238* | (2006.01) | |
| *H01L 27/12* | (2006.01) | |
| *H01L 29/10* | (2006.01) | |

(52) U.S. Cl.
CPC ......... *H01L 27/1211* (2013.01); *H01L 21/0245* (2013.01); *H01L 21/823821* (2013.01); *H01L 21/02532* (2013.01); *H01L 29/165* (2013.01); *H01L 29/1054* (2013.01); *Y10S 438/933* (2013.01)
USPC ........... 438/157; 438/285; 438/933; 438/302; 438/156; 438/268; 438/478; 438/299; 438/400; 438/696; 257/220; 257/302; 257/328; 257/392; 257/E21.562; 716/106

(58) Field of Classification Search
CPC ............. H01L 27/1211; H01L 29/785; H01L 29/66795; H01L 29/165; H01L 21/02532; H01L 27/1207; H01L 29/6656
USPC .......... 257/190–370; 438/198–400, 154–164; 716/100–110
See application file for complete search history.

(56) References Cited

U.S. PATENT DOCUMENTS

| | | | |
|---|---|---|---|
| 6,794,718 B2 | 9/2004 | Nowak et al. | |
| 7,078,299 B2 * | 7/2006 | Maszara et al. | 438/285 |

(Continued)

OTHER PUBLICATIONS

Method and System for Fabricating a High-k/metal Gate finFET CMOS by Simultaneously Forming Si-nFET and SiGe-pFET on a Semiconductor Substrate an IP.com Prior Art Database Technical Disclosure Authors et. al.: Disclosed Anonymously IP.com No. IPCOM00217323D IP.com Electronic Publication: May 7, 2012.*

(Continued)

*Primary Examiner* — Marc Armand
*Assistant Examiner* — Nelson Garces
(74) *Attorney, Agent, or Firm* — Thomas Grzesik; Fleit Gibbons Gutman Bongini & Bianco PL

(57) ABSTRACT

Various embodiments form silicon and silicon germanium fins on a semiconductor wafer. In one embodiment a semiconductor wafer is obtained. The semiconductor wafer comprises a substrate, a dielectric layer, and a semiconductor layer including silicon germanium (SiGe). At least one SiGe fin is formed from at least a first SiGe region of the semiconductor layer in at least one PFET region of the semiconductor wafer. Strained silicon is epitaxially grown on at least a second SiGe region of the semiconductor layer. At least one strained silicon fin is formed from the strained silicon in at least one NFET region of the semiconductor wafer.

5 Claims, 10 Drawing Sheets

(56) References Cited

U.S. PATENT DOCUMENTS

| | | | |
|---|---|---|---|
| 7,115,945 | B2 | 10/2006 | Lee et al. |
| 7,198,995 | B2 | 4/2007 | Chidambarrao et al. |
| 7,619,239 | B2 | 11/2009 | Irisawa et al. |
| 8,021,949 | B2 * | 9/2011 | Cheng et al. ............... 438/302 |
| 8,169,025 | B2 | 5/2012 | Bedell et al. |
| 8,207,038 | B2 | 6/2012 | Cheng et al. |
| 2011/0283245 | A1 * | 11/2011 | Shen et al. ................ 716/106 |
| 2012/0018730 | A1 | 1/2012 | Kanakasabapathy et al. |
| 2013/0244392 | A1 * | 9/2013 | Oh et al. .................... 438/299 |

OTHER PUBLICATIONS

Non Final Office Action dated Jan. 17, 2014 for U.S. Appl. No. 13/800,984.

Disclosed anonymously., Method and System for Fabricating a High -K/metal Gate finFET CMOS by simultaneously Forming SI-nFET and SiGe-pFET on a Semiconductor Substrate. pp. 1-5, Published electronically May 7, 2012. IP.com No. IPCOM000217323D.

Maitra, K., et al., "Aggressively Scaled Strained-Silicon-on-Insulator Undoped-Body Hih-k/Metal-Gate nFinFETs for High-Performance Logic Applications," 0741-3106/copyright 2011 IEEE, IEEE Electron Device Letters, vol. 32, No. 6, Jun. 2011.

Ok, I., et al., "Strained SiGe and Si FinFETs for High Performance Logic with SiGe/Si Stack on SOI," IEDM10-776, 978-1-4233-7419-6/10/copyright 2010 IEEE.

Wu, San Lein, et al., "Enhanced CMOS Performances Using Substrate Strained-SiGe and Mechanical Strained-Si Technology," IEEE Electron Device Letters, vol. 27, No. 1, Jan. 2006, 0741-3106/copyright 2005 IEEE.

* cited by examiner

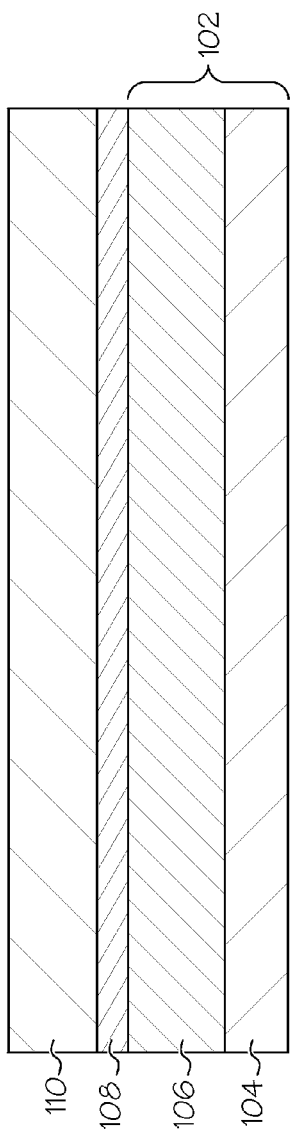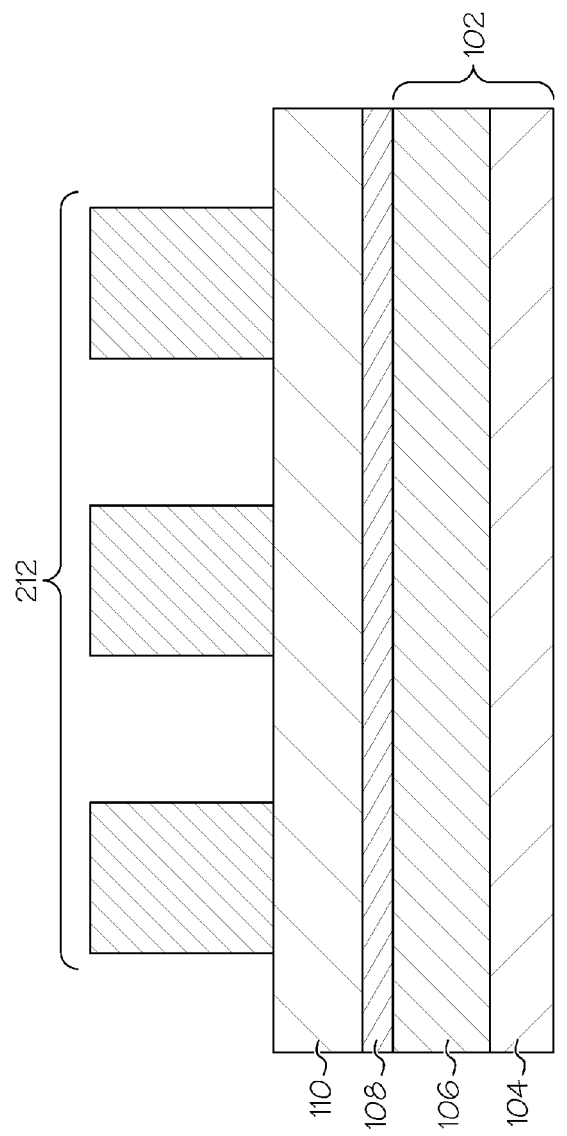

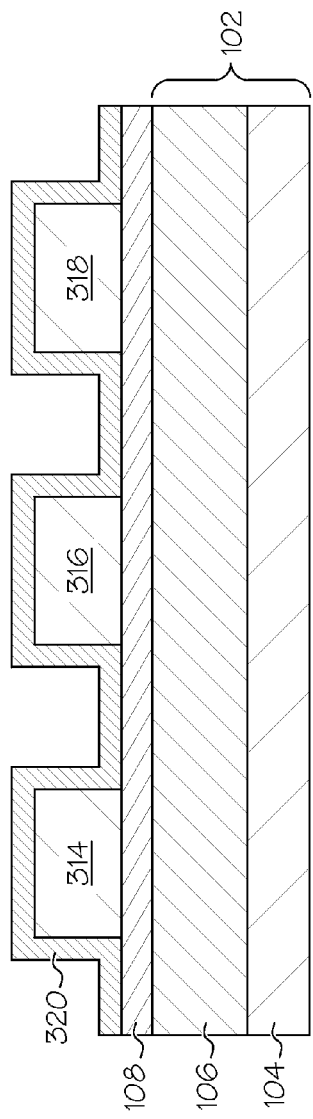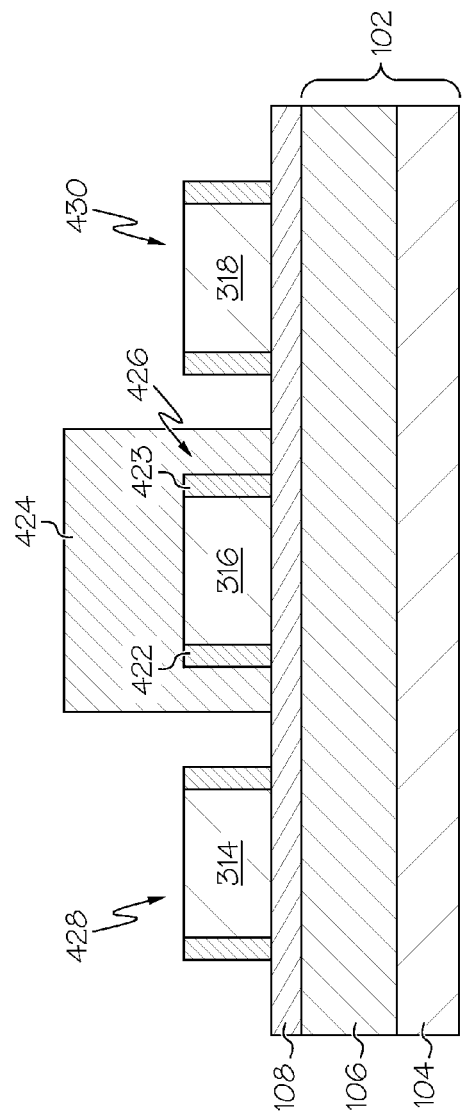

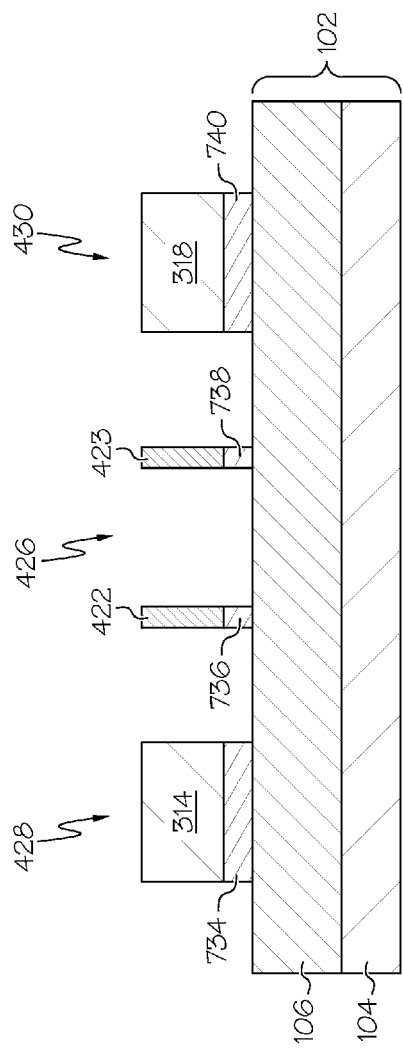
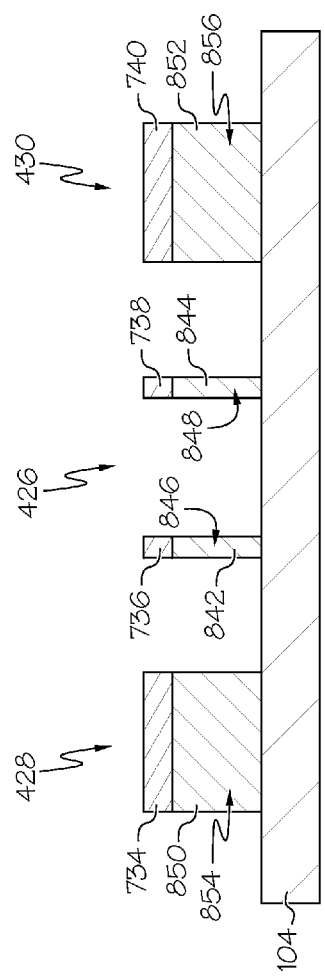

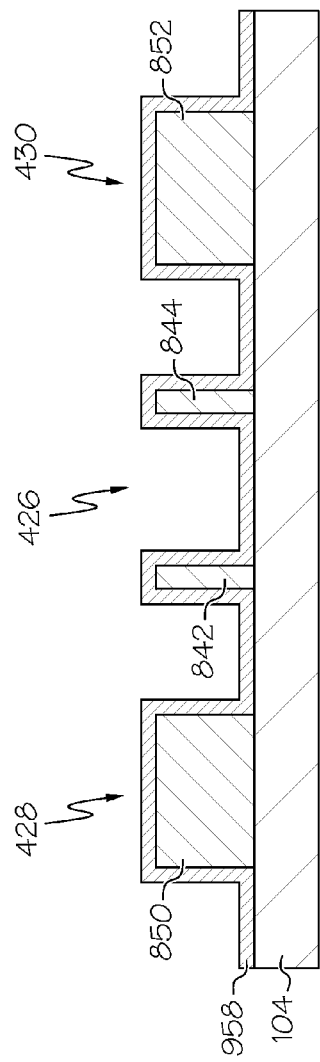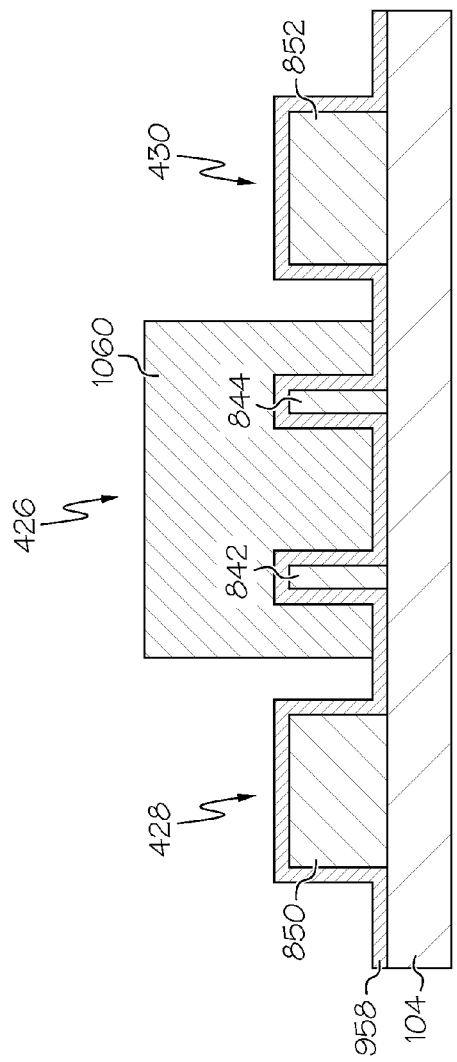

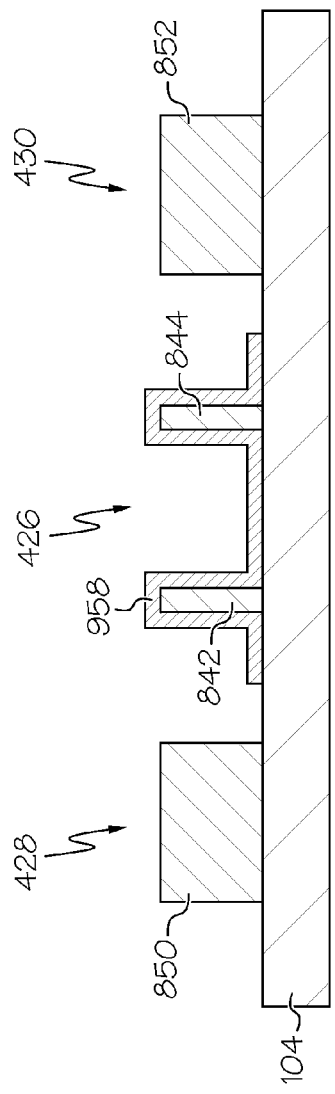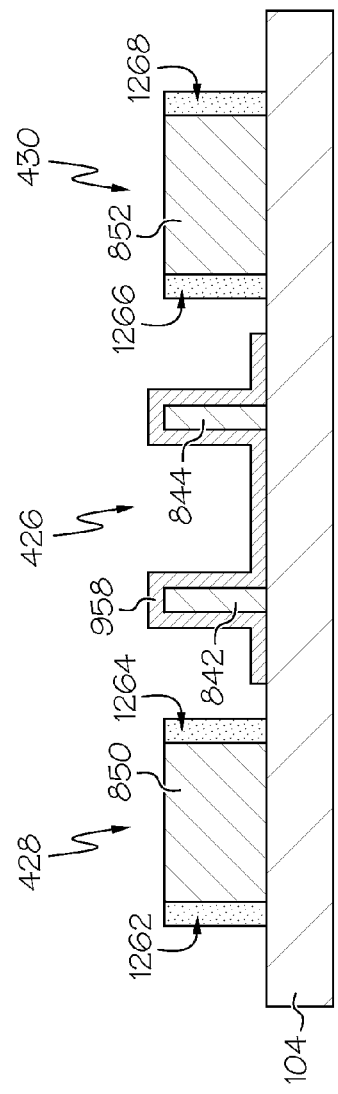

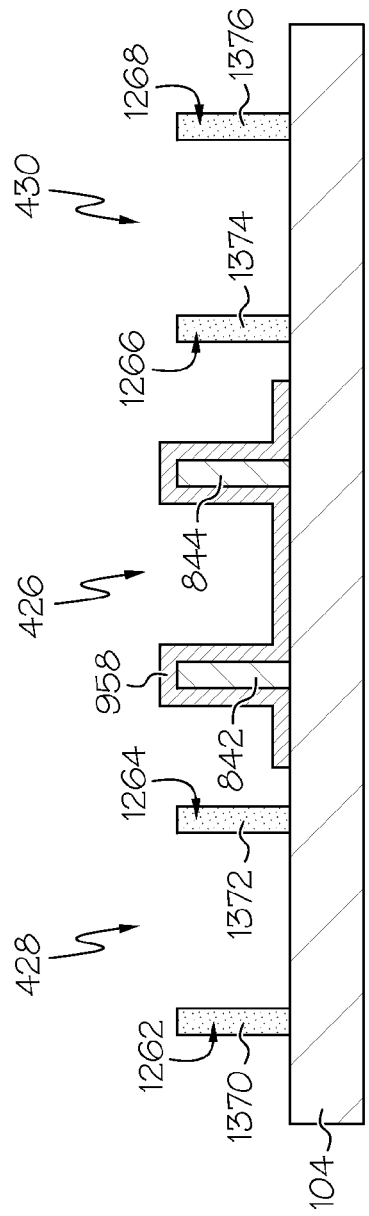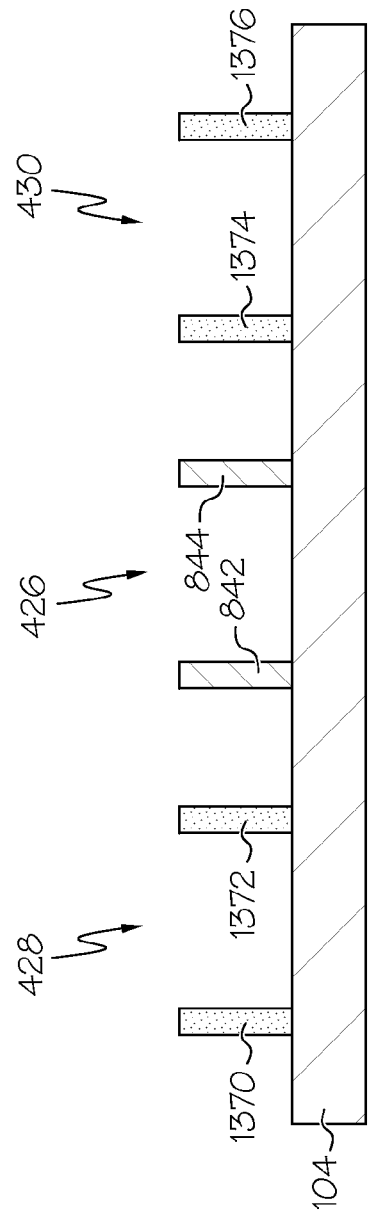

US 8,883,578 B2

STRAINED SILICON NFET AND SILICON GERMANIUM PFET ON SAME WAFER

CROSS-REFERENCE TO RELATED APPLICATIONS

This application is based upon and claims priority from prior U.S. patent application Ser. No. 13/800,984, filed on Mar. 13, 2013, the entire disclosure of which is herein incorporated by reference in its entirety.

BACKGROUND

The present invention generally relates to semiconductor devices, and more particularly relates semiconductor wafers comprising both strained silicon nFET fins and silicon germanium pFET fins.

As integrated circuits continue to scale downward in size, the finFET (fin field effect transistor) is becoming an attractive device for use with smaller nodes, e.g., the 22 nm node and beyond. In a finFET, the channel is formed by a semiconductor fin and a gate electrode is located on at least two sides of the fin. Due to the advantageous feature of full depletion in a finFET, the increased number of sides on which the gate electrode controls the channel of the finFET enhances the controllability of the channel in a finFET compared to a planar MOSFET. The improved control of the channel allows smaller device dimensions with less short channel effects as well as larger electrical current that can be switched at high speeds. A finFET device generally has faster switching times, equivalent or higher current density, and much improved short channel control than planar CMOS technology utilizing similar critical dimensions. However, one main detractor for realizing such finFET device technology is the ineffectiveness of conventional stress elements that are applied to such devices.

BRIEF SUMMARY

In one embodiment, a method for forming silicon and silicon germanium fins on a semiconductor wafer is disclosed. The semiconductor wafer comprises a substrate, a dielectric layer formed on the substrate, and a semiconductor layer formed on the dielectric layer. The method comprises forming a semiconductor wafer. The semiconductor wafer comprises a substrate, a dielectric layer formed on the substrate, and a semiconductor layer formed on the dielectric layer. The semiconductor layer comprises silicon germanium (SiGe) layer formed on the dielectric layer. At least one SiGe fin is formed from at least a first SiGe region of the semiconductor layer. Strained silicon is epitaxially grown on at least a second SiGe region of the semiconductor layer. At least one strained silicon fin is formed from the strained silicon in at least one NFET region of the semiconductor wafer.

In another embodiment, a semiconductor wafer is disclosed. The semiconductor wafer comprises a substrate and a dielectric layer formed on the substrate. A plurality of fins is formed on the dielectric layer. At least a first fin comprises silicon germanium formed within a PFET region of the semiconductor wafer. At least a second fin comprises strained silicon formed within the NFET region of the semiconductor wafer.

In yet another embodiment, a non-transitory computer readable medium is disclosed. The non-transitory computer readable medium is encoded with a program for fabricating strained and relaxed silicon and silicon germanium fins on a semiconductor wafer. The program comprises instructions configured to perform a method. The semiconductor wafer comprises a substrate, a dielectric layer formed on the substrate, and a semiconductor layer formed on the dielectric layer. The method comprises forming a semiconductor wafer. The semiconductor wafer comprises a substrate, a dielectric layer formed on the substrate, and a semiconductor layer formed on the dielectric layer. The semiconductor layer comprises silicon germanium (SiGe) layer formed on the dielectric layer. At least one SiGe fin is formed from at least a first SiGe region of the semiconductor layer. Strained silicon is epitaxially grown on at least a second SiGe region of the semiconductor layer. At least one strained silicon fin is formed from the strained silicon in at least one NFET region of the semiconductor wafer.

BRIEF DESCRIPTION OF THE SEVERAL VIEWS OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which:

FIG. 1 is a cross-sectional diagram illustrating a semiconductor wafer comprising a dielectric layer, a semiconductor layer, a pad layer, and a mandrel layer according to one embodiment of the present invention;

FIG. 2 is a cross-sectional diagram illustrating a mask layer deposited over portions of the mandrel layer to create a plurality of mandrels according to one embodiment of the present invention;

FIG. 3 is a cross-sectional diagram illustrating a spacer material deposited over the plurality of mandrels according to one embodiment of the present invention;

FIG. 4 is a cross-sectional diagram illustrating sidewall spacers on each of the plurality of mandrels and at least one mandrel having been masked with a masking layer according to one embodiment of the present invention;

FIG. 7 is a cross-sectional diagram illustrating the masking layers having been removed from the masked mandrels of FIG. 6, and exposed portions of the pad layer having been etched according to one embodiment of the present invention;

FIG. 8 is a cross-sectional diagram illustrating portions of the semiconductor layer of the wafer having been etched forming silicon germanium fins within a PFET region(s) of the semiconductor wafer and semiconductor regions within NFET regions of the semiconductor wafer according to one embodiment of the present invention;

FIG. 9 is a cross-sectional diagram illustrating a masking layer having been deposited over the silicon germanium fins and the semiconductor regions according to one embodiment of the present invention;

FIG. 10 is a cross-sectional diagram illustrating a masking layer have been formed over the SiGe fins according to one embodiment of the present invention;

FIG. 11 is a cross-sectional diagram illustrating the masking layer having been removed from the semiconductor regions and the masking layer having been removed from the silicon germanium fins according to one embodiment of the present invention;

FIG. 12 is a cross-sectional diagram illustrating strained silicon having been epitaxially grown on the semiconductor regions according to one embodiment of the present invention;

FIG. 13 is a cross-sectional diagram illustrating the semiconductor regions having been removed forming strained silicon fins according to one embodiment of the present invention;

FIG. 14 is a cross-sectional diagram illustrating the masking layer having been removed from the silicon germanium fins according to one embodiment of the present invention;

DETAILED DESCRIPTION

Figure 5:
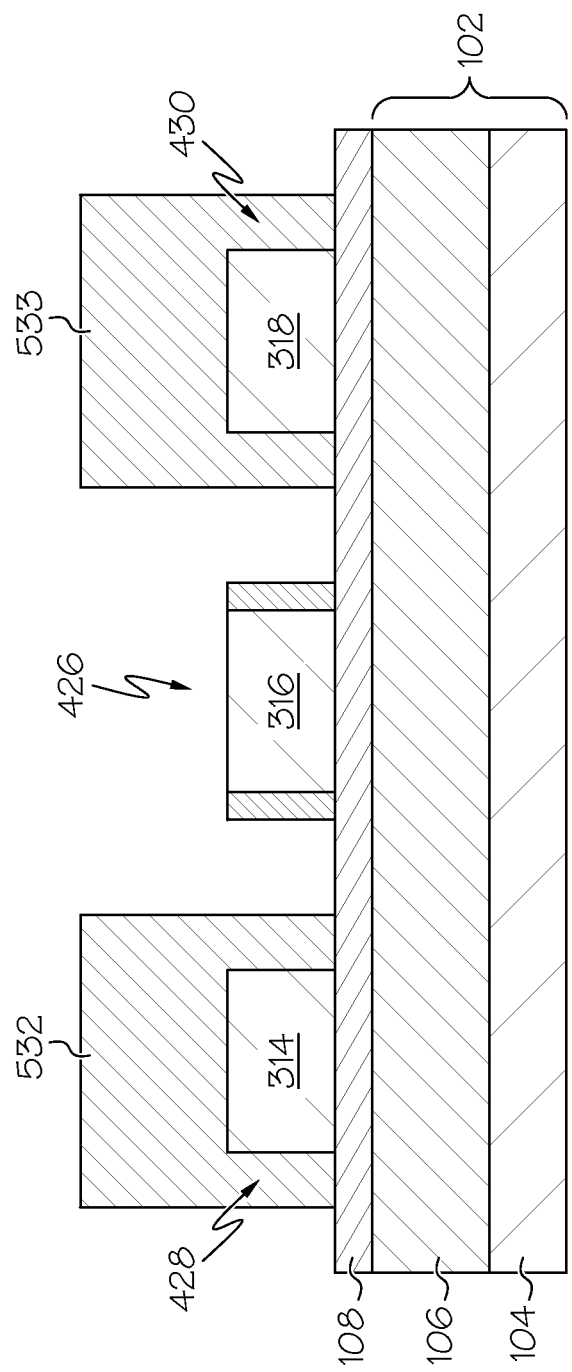
FIG. 5 is a cross-sectional diagram illustrating the masked mandrel of FIG. 4 after the masking layer has been removed, and the unmasked mandrels of FIG. 4 after having their sidewall spacers removed and subsequently masked by a masking layer according to one embodiment of the present invention.

As semiconductor devices continue to scale stress engineering from external stressors becomes more challenging due to the pitch scaling. A strained silicon substrate can be utilized to more efficiently generate the channel strain necessary to achieve high mobility for carrier transport. In addition, a silicon germanium (SiGe) substrate can be utilized for pFET devices for reducing their work function to reach targeted device threshold voltages. Integrating both types of substrates (strained silicon for nFET devices, SiGe for pFET devices) on the same wafer can be challenging. However, one or more embodiments discussed below provide methods and structures for forming strained silicon NFET fins and silicon germanium PFET fins on the same wafer without significantly increasing the process complexity.

It is to be understood that various embodiments are described in terms of a given illustrative architecture having a semiconductor-on-insulator (SOI) wafer; however, other architectures, structures, substrate materials and process features and steps may be varied within the scope of the present invention.

Referring now to the drawings in which like numerals represent the same or similar elements and initially to FIG. 1, a wafer 102 is shown. The wafer 102, in one embodiment, is a semiconductor-on-insulator (SOI) wafer having a substrate (not shown) comprising bulk silicon, germanium, gallium arsenide, or any other substrate material. A dielectric layer 104 is grown or formed on the substrate. The dielectric layer 104, in one embodiment, comprises a buried oxide layer (BOX) or other dielectric material. A semiconductor layer 106 comprising silicon germanium (SiGe) is grown or formed on the dielectric layer 104. In one embodiment, the content of Ge within the semiconductor layer 106 is 20% to 30%. However, other percentages of Ge content within the semiconductor layer 106 are applicable as well.

In one embodiment, a pad/capping layer 108 is formed on the semiconductor 106. It should be noted that in other embodiments, the pad/capping layer 108 is formed during or after a fin patterning process. The pad layer 108, in one embodiment, comprises an oxide (e.g., silicon dioxide) or a nitride (e.g., silicon nitride). Other materials may also be employed such as (but not limited to) organic dielectrics, etc. A mandrel layer 110 is formed on the pad layer 108. The mandrel layer 110 may include silicon (e.g., polycrystalline silicon (polysilicon), amorphous silicon) and may be plasma-enhanced chemical vapor deposition (PECVD) polysilicon or amorphous silicon, or other suitable material.

A blocking/masking layer 212 is formed on the mandrel layer 110, which is subsequently patterned and etched, as shown in FIG. 2. The blocking/masking layer 212 is employed as a mask to etch the mandrel layer 110. The blocking/masking layer 212, in one embodiment, comprises a photoresist material or hard mask such as (but not limited to) silicon nitride, oxide, oxinitride, etc. After the mandrel layer 110 is etched the blocking/masking layer 212 is removed leaving a plurality of mandrels 314, 316, 318 on the pad layer 108, as shown in FIG. 3. In an embodiment where the pad layer 108 is formed during a subsequent process, the mandrels 314, 316, 318 are formed on the semiconductor layer 106. The mandrels 314, 316, 318 provide a corrugated topology on which spacers are formed using SIT spacer formation. FIG. 3 also shows that a spacer material 320 is deposited over and around the mandrels 314, 316, 318 and on a top surface of the pad layer 108 (if formed). In one embodiment, the spacer material 320 comprises nitride, but other materials are applicable as well.

The spacer material 320 is etched to form spacers 422, 423 on the sidewalls of each of the mandrels 314, 316, 318 using a sidewall image transfer (SIT) spacer formation etch/process, as shown in FIG. 4. The SIT spacer etch is a directional reactive ion etch (RIE). The SIT spacer etch removes material from horizontal surfaces faster than it removes material from vertical surfaces, allowing for relative precision in spacer thickness formation. FIG. 4 further shows that after the sidewall spacers 422, 423 are formed a masking/resist material 424 is formed over the region(s) 426 of the wafer 102 corresponding to pFET devices. For example, the masking/resist material 424 can be formed over the pad layer 108 and the mandrels 314, 316, 318 including their spacers 422, 423. The masking/resist material 424 is then lithographically patterned such that only masking/resist material 424 remains over mandrel(s) 316 including its spacer 422, 423 within the PFET region(s) 426 of the wafer 102. The mandrels 314, 318 in the nFET regions 428, 430 of the wafer 102 are left exposed.

Figure 6:
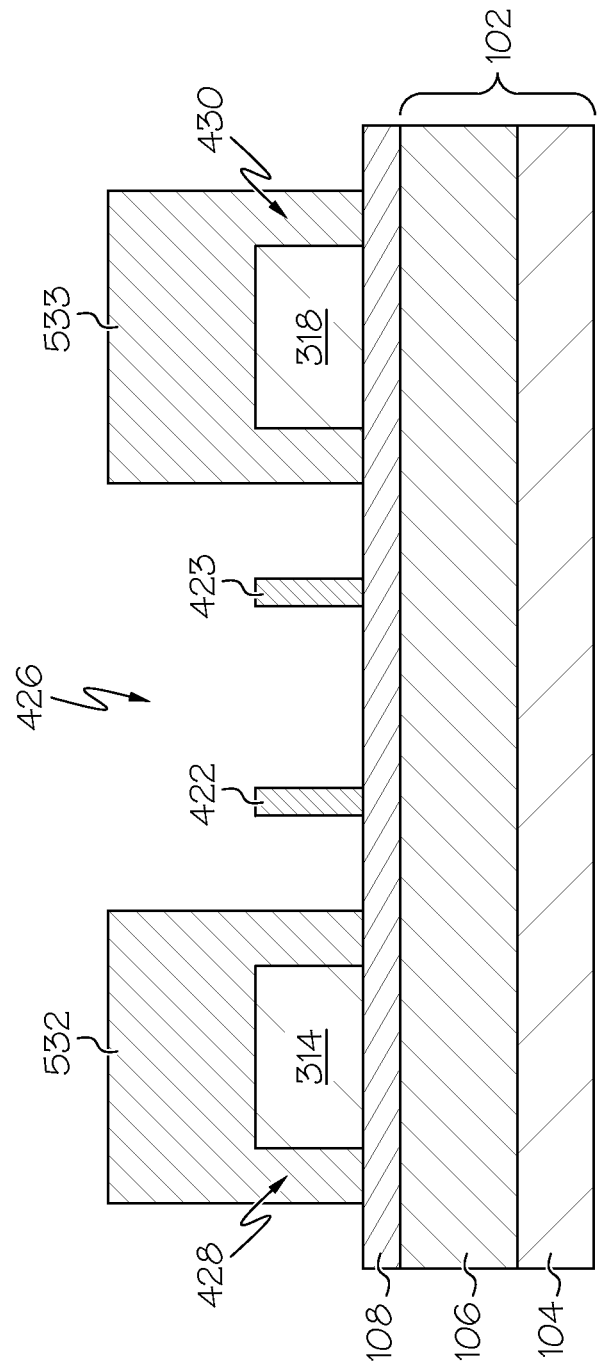
FIG. 6 is a cross-sectional diagram illustrating the unmasked mandrel of FIG. 5 having been removed according to one embodiment of the present invention.

An etching process is then performed to remove the spacers 422, 423 of the exposed mandrels 314, 318 in the NFET regions 428, 430, as shown in FIG. 5. A masking/resist material 532, 533 is then deposited/formed over the mandrels 314, 318 in the NFET region(s) 428, 430 similar to that discussed above with respect to FIG. 4. The exposed mandrel(s) 316 within the PFET region 426 is then removed leaving the spacers 322, 323 of this mandrel 316 on the pad layer 108, as shown in FIG. 6. Mandrels may be removed by a mandrel pull, which can include etching the polysilicon or amorphous silicon that comprises the mandrels.

The masking/resist material 532, 533 covering the mandrels 314, 318 in the NFET regions 428, 430 is removed, and an etching process such as RIE is performed on the pad layer 108 (if formed) as shown in FIG. 7. The mandrels 314, 318 and the spacers 422, 423 act as a masking layer that prevent corresponding portions 734, 736, 738, 740 of the pad layer 108 from being etch. The mandrels 314, 318 the spacers 422, 423 are then removed using an additional etching process. The portions 734, 736, 738, 740 of the pad layer 108 are used as a masking layer while exposed portions of the semiconductor layer 106 are etched down to the dielectric layer 104, as shown in FIG. 8. If the pad layer 108 has not been previously formed it can be formed and patterned to create the portions shown in FIG. 7 prior to etching the exposed portions of the semiconductor layer 106. The exposed portions of the semiconductor layer 106 can be etched using RIE or any other suitable etching process.

This etching process forms a plurality of fins 842, 844 within the pFET region(s) 426 of the wafer 102. These pFET fins 842, 844 each comprise a portion 846, 848 of the semiconductor (SiGe) layer 106. Each of the pFET fins 842, 844 has a thickness corresponding to the thickness of the sidewall spacers 422, 423 (and pad layer portion 736, 738 if formed). This etching process also defines semiconductor (SiGe) regions 850, 852 for forming NFET fins, as discussed below. Each of the semiconductor regions 850, 852 comprises a portion 854, 856 of the semiconductor (SiGe) layer 106.

An additional etching process such as RIE is performed to remove the portions 734, 736, 738, 740 of the pad layer 108 (if formed) from the fins 842, 844 and the semiconductor regions 850, 852, as shown in FIG. 9. A mask 958 is deposited over exposed regions of the dielectric layer 104, the semiconductor regions 850, 852, and the fins 842, 844. The mask 958 comprises nitride or another suitable material. A blocking/masking layer 1060 is formed over and around the pFET fins 842, 844 and corresponding nitride 958 as shown in FIG. 10. The blocking/masking layer 1060 comprises a photoresist material or hard mask such as (but not limited to) silicon nitride, oxide, oxinitride, etc. An etching process is performed to remove the nitride 958 material from the semiconductor regions 850, 852, as shown in FIG. 11. The blocking/masking layer 1060 prevents the nitride 958 from being removed from the pFET fins 842, 844 during this etching process. After this etching process the blocking/masking layer 1060 is removed from the pFET fins 842, 844 and corresponding nitride 958.

An epitaxy process is performed to grow strained Si layer 1262, 1264, 1266, 1268 on the sidewalls of the semiconductor regions 850, 852 comprising strained SiGe. For example, a selective epitaxy process can be used to grow strained silicon on the exposed SiGe surface of the semiconductor regions 850, 852, but does not grow silicon on dielectric layers, such as nitride or oxide. Once the strained Si layers 1262, 1264, 1266, 1268 have been formed, the semiconductor regions 850, 852 are removed by an etching process such as (but not limited to) a hydrogen chloride etch as shown in FIG. 13. The etching process forms a plurality of fins 1370, 1372, 1374, 1376 within the NFET regions 428, 430 of the wafer 102. The NFET fins 1370, 1372, 1374, 1376 comprise the strained silicon 1262, 1264, 1266, 1268 formed during the epitaxy process discussed above. The nitride 958 is then removed from the PFET fins 842, 844 as shown in FIG. 14. The resulting wafer 102 comprises both SiGe fins 842, 844 and Si fins 1370, 1372, 1374, 1376 on the same wafer 102. The strained silicon fins 1370, 1372, 1374, 1376 provide enhanced electron mobility for the nFET devices, while the SiGe fins 842, 844 reduce the threshold voltage of the pFET devices. Once the fins 842, 844, are formed conventional fabrication process can be used to create devices implementing these fins.

Figure 15:
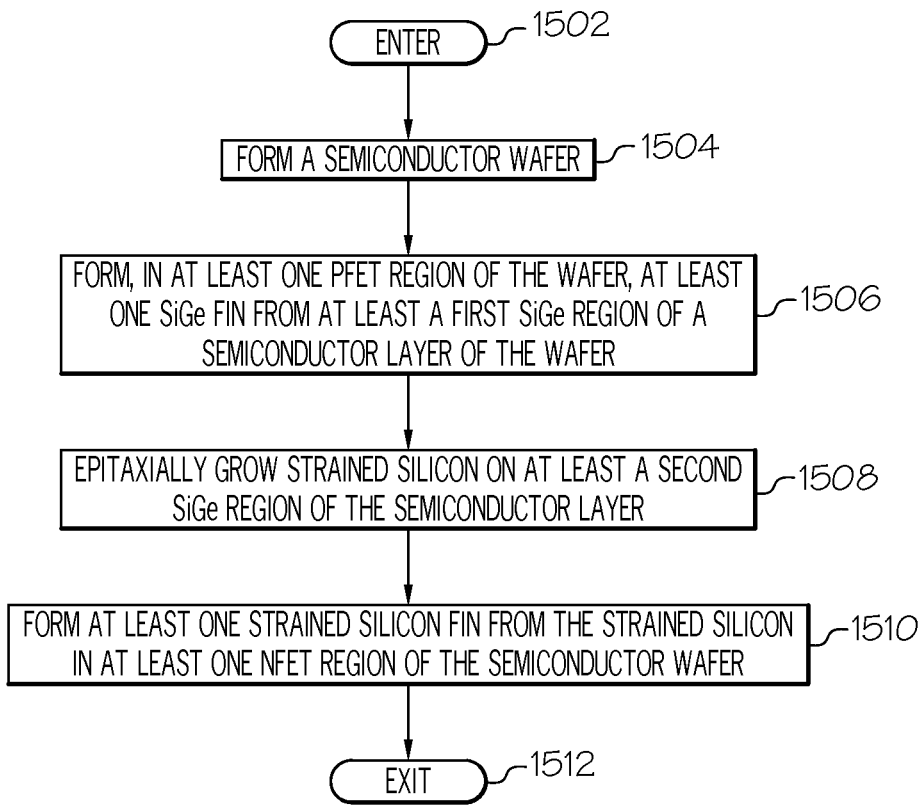
FIG. 15 is an operational flow diagram illustrating one example of a process for fabricating silicon and silicon germanium fins on the same semiconductor wafer according to one embodiment of the present invention.

FIG. 15 is an operational flow diagram illustrating a process for fabricating silicon and silicon germanium fins on the same semiconductor wafer. The operational flow diagram of FIG. 15 begins at step 1502 and flows directly to step 1504. A semiconductor wafer, at step 1504, is formed/obtained. The semiconductor wafer 102 comprises a substrate, a dielectric layer 104 formed on the substrate, and a semiconductor layer 106 formed on the dielectric layer 104. The semiconductor layer 106 comprises silicon germanium (SiGe). At least one SiGe fin 842, at step 1506, is formed from at least a first SiGe region 846 of the semiconductor layer 106 in at least one PFET region 426 of the semiconductor wafer 106. Strained silicon 1262, at step 1508, is epitaxially grown on at least a second SiGe region 854 of the semiconductor layer 106. At least one strained silicon fin 1370, at step 1510, is formed from the strained silicon 1262 in at least one NFET region 428 of the semiconductor wafer 106. The control flow then exits at step 1512.

Figure 16:
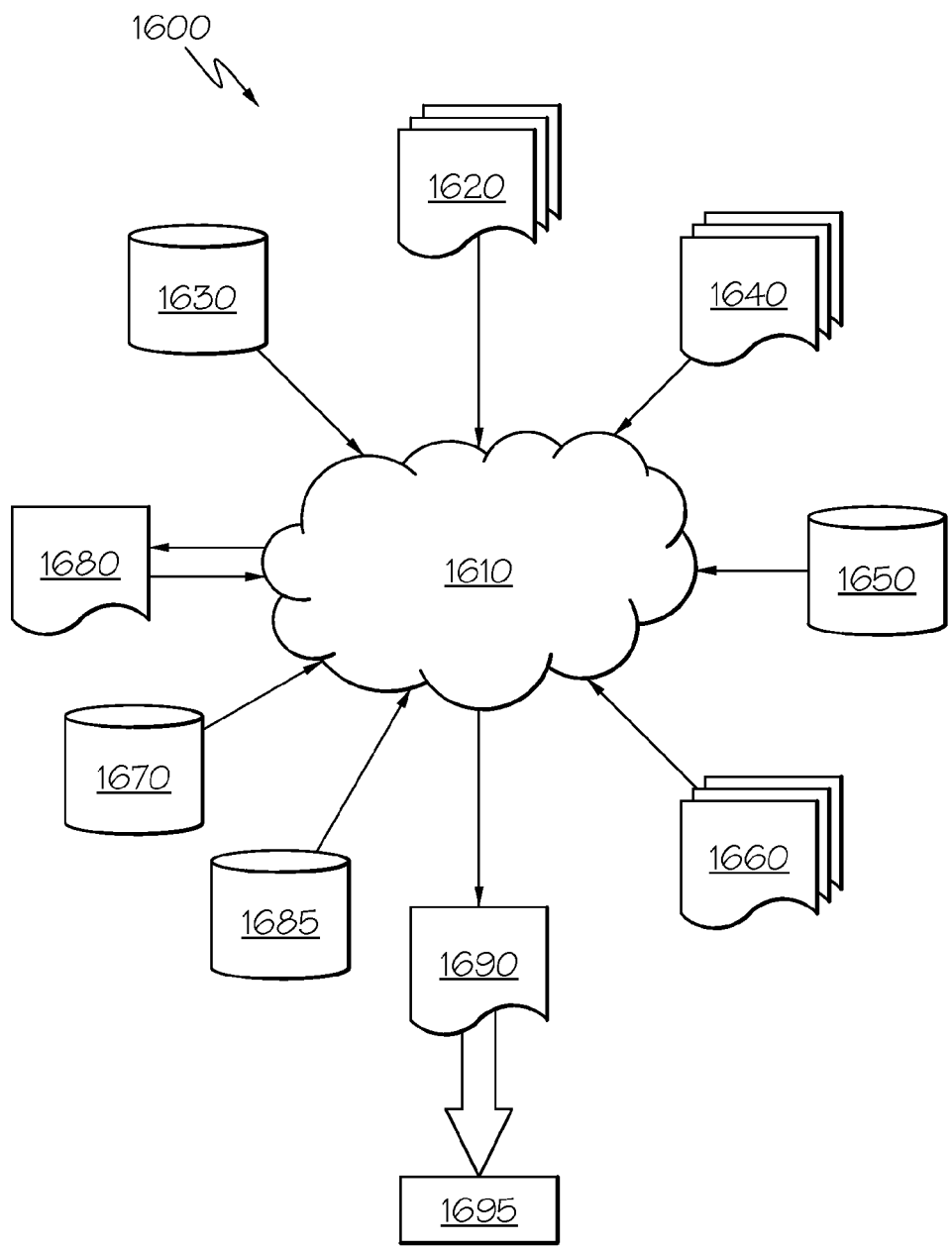
FIG. 16 is a flow diagram of a design process used in semiconductor design, manufacture, and/or test.

FIG. 16 shows a block diagram of an exemplary design flow 1600 used for example, in semiconductor IC logic design, simulation, test, layout, and manufacture. Design flow 1600 includes processes and mechanisms for processing design structures or devices to generate logically or otherwise functionally equivalent representations of the design structures and/or devices described above and shown in FIGS. 1-14. The design structures processed and/or generated by design flow 1600 may be encoded on computer-readable transmission or storage media to include data and/or instructions that when executed or otherwise processed on a data processing system generate a logically, structurally, mechanically, or otherwise functionally equivalent representation of hardware components, circuits, devices, or systems. Design flow 1600 may vary depending on the type of representation being designed. For example, a design flow 1600 for building an application specific IC (ASIC) may differ from a design flow 1600 for designing a standard component or from a design flow 1600 for instantiating the design into a programmable array, for example a programmable gate array (PGA) or a field programmable gate array (FPGA) offered by ALTERA® Inc. or XILINIX® Inc.

FIG. 16 illustrates multiple such design structures including an input design structure 1620 that is preferably processed by a design process 1610. Design structure 1620 may be a logical simulation design structure generated and processed by design process 1210 to produce a logically equivalent functional representation of a hardware device. Design structure 1620 may also or alternatively comprise data and/or program instructions that when processed by design process 1610, generate a functional representation of the physical structure of a hardware device. Whether representing functional and/or structural design features, design structure 1620 may be generated using electronic computer-aided design (ECAD) such as implemented by a core developer/designer. When encoded on a machine-readable data transmission, gate array, or storage medium, design structure 1620 may be accessed and processed by one or more hardware and/or software modules within design process 1610 to simulate or otherwise functionally represent an electronic component, circuit, electronic or logic module, apparatus, device, or system such as those shown in FIGS. 1-14. As such, design structure 1620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1610 preferably employs and incorporates hardware and/or software modules for synthesizing, translating, or otherwise processing a design/simulation functional equivalent of the components, circuits, devices, or logic structures shown in FIGS. 1-14 to generate a netlist 1680 which may contain design structures such as design structure 1620. Netlist 1680 may comprise, for example, compiled or otherwise processed data structures representing a list of wires, discrete components, logic gates, control circuits, I/O devices, models, etc. that describes the connections to other elements and circuits in an integrated circuit design. Netlist 1680 may be synthesized using an iterative process in which netlist 1680 is resynthesized one or more times depending on design specifications and parameters for the device. As with other design structure types described herein, netlist 1680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1610 may include hardware and software modules for processing a variety of input data structure types including netlist 1680. Such data structure types may reside, for example, within library elements 1630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1640, characterization data 1650, verification data 1660, design rules 1670, and test data files 1685 which may include input test patterns, output test results, and other testing information. Design process 1610 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1610 without deviating from the scope and spirit of the invention. Design process 1610 may also include modules for performing standard circuit design processes such as timing analysis, verification, design rule checking, place and route operations, etc.

Design process 1610 employs and incorporates logic and physical design tools such as HDL compilers and simulation model build tools to process design structure 1620 together with some or all of the depicted supporting data structures along with any additional mechanical design or data (if applicable), to generate a second design structure 1690. Design structure 1690 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 1620, design structure 1690 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-14. In one embodiment, design structure 1690 may comprise a compiled, executable HDL simulation model that functionally simulates the devices shown in FIGS. 1-14.

Design structure 1690 may also employ a data format used for the exchange of layout data of integrated circuits and/or symbolic data format (e.g., information stored in a GDSII (GDS2), GL1, OASIS, map files, or any other suitable format for storing such design data structures). Design structure 1690 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-14. Design structure 1690 may then proceed to a stage 1695 where, for example, design structure 1690: proceeds to tape-out, is released to manufacturing, is released to a mask house, is sent to another design house, is sent back to the customer, etc.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A non-transitory computer readable medium encoded with a program for fabricating silicon and silicon germanium fins on a semiconductor wafer comprising a substrate, a dielectric layer formed on the substrate, and a semiconductor layer formed on the dielectric layer, the program comprising instructions configured to perform a method comprising:

forming, in at least one pFET region of the semiconductor wafer, at least one SiGe fin from at least a first silicon germanium (SiGe) comprising region in the semiconductor layer;

epitaxially growing strained silicon on at least a second SiGe comprising region of the semiconductor layer;

forming at least one strained silicon fin from the strained silicon in at least one nFET region of the semiconductor wafer;

forming a pad layer on the semiconductor layer;

forming a plurality of mandrels, wherein at least a first mandrel is formed on a first portion of the pad layer over the first SiGe comprising region, and wherein at least a second mandrel is formed on at least a second portion of the pad layer over the second SiGe comprising region;

depositing a spacer material over the plurality of mandrels and portions of the pad layer;

removing the spacer material from horizontal surfaces of the plurality of mandrels and the portions of the pad layer, wherein the removing forms a first sidewall spacer and at least a second sidewall spacer on each of the plurality of mandrels, and wherein the removing exposes the portions of the pad layer;

removing the first and second sidewall spacers from the at least second mandrel, the removing exposing portions of the pad layer under the first and second sidewall spacers; and removing the at least first mandrel selective to the first and second sidewall spacers of the at least first mandrel, the removing exposing a portion of the pad layer under the at least first mandrel, wherein forming the at least one SiGe fin comprises:

etching the exposed portions of the pad layer, wherein the second portion of the pad layer remains under the at least second mandrel, and wherein the third portion of the pad layer remains under the first sidewall spacer of the first mandrel and the fourth portion of the pad layer remains under the second sidewall spacer of the first mandrel, wherein etching the exposed portions of the pad layer exposes portions of the semiconductor layer;

after etching the exposed portions of the pad layer, removing at least the second mandrel, the first sidewall spacer of the first mandrel, and the second sidewall spacer of the first mandrel;

etching the exposed regions of the semiconductor layer, wherein the etching forms the at the least one SiGe fin under the third portion of the pad layer and at least one additional SiGe fin under the fourth portion of the pad layer; and removing at least the third and fourth portions of the pad layer.

2. The non-transitory computer readable medium of claim 1, wherein etching the exposed regions of the semiconductor layer forms the at least second SiGe comprising region under the at least second portion of the pad layer.

3. The non-transitory computer readable medium of claim 1, wherein epitaxially growing strained silicon comprises:

removing the at least second portion of the pad layer.

4. The non-transitory computer readable medium of claim 3, wherein epitaxially growing strained silicon further comprises:

epitaxially growing strained silicon on vertical surfaces of the at least second SiGe comprising region.

5. The non-transitory computer readable medium of claim 4, wherein forming the at least one strained silicon fin comprises:

selectively removing the at least second SiGe comprising region after the strained silicon has been epitaxially grown.

* * * * *